United States Patent [19]

Sato et al.

[11] Patent Number: 5,205,870

[45] Date of Patent: Apr. 27, 1993

[54] VAPOR DEPOSITION APPARATUS

[75] Inventors: Yuusuke Sato; Akio Ui, both of Tokyo; Keiichi Akagawa, Kanagawa; Toshimitsu Ohmine, Tokyo, all of Japan

[73] Assignee: Kabushiki Kaisha Toshiba, Kawasaki, Japan

[21] Appl. No.: 890,145

[22] Filed: May 29, 1992

[30] Foreign Application Priority Data

May 29, 1991 [JP] Japan .................................. 3-125725

[51] Int. Cl.$^5$ ............................................. C23C 16/48
[52] U.S. Cl. ...................................... 118/722; 427/582
[58] Field of Search ...................... 118/722; 427/53.1

[56] References Cited

U.S. PATENT DOCUMENTS 4,500,565  2/1985  Hiramoto .......................... 427/39
4,525,382  6/1985  Sugioka ............................ 118/719
4,664,057  5/1987  Hemmati ......................... 427/53.1

OTHER PUBLICATIONS

Chemical Physics Letters, vol. 130, No. 4, pp. 321–329, Elsevier Science Publishers, Oct. 10, 1986 J. J. O'Brien, et al.; "Detection of the SiH$_2$ Radical by Intracavity Laser Absorption Spectroscopy".

Primary Examiner—Richard Bueker
Attorney, Agent, or Firm—Oblon, Spivak, McClelland, Maier & Neustadt

[57] ABSTRACT

An argon (Ar$^+$) laser has a resonator. A reaction chamber is integrally formed in the resonator. A voltage is applied to electrodes, which discharge electricity to excite argon atoms in the resonator to produce a laser beam. The laser beam is continuously oscillated between total reflection mirrors disposed at opposite ends of the resonator. A substrate is disposed in the reaction chamber into which a material gas is introduced. The material gas absorbs the laser beam, to decompose and deposit as a thin film over the substrate.

29 Claims, 8 Drawing Sheets

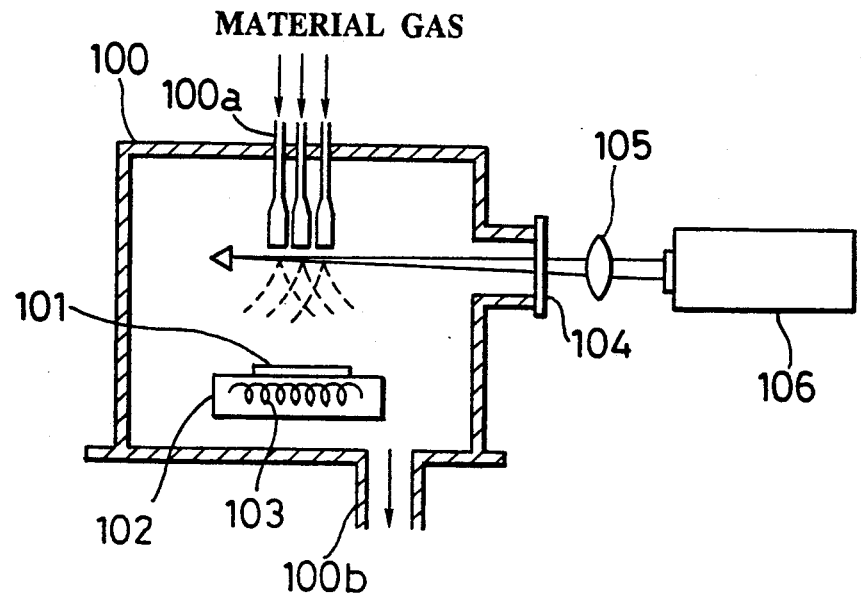
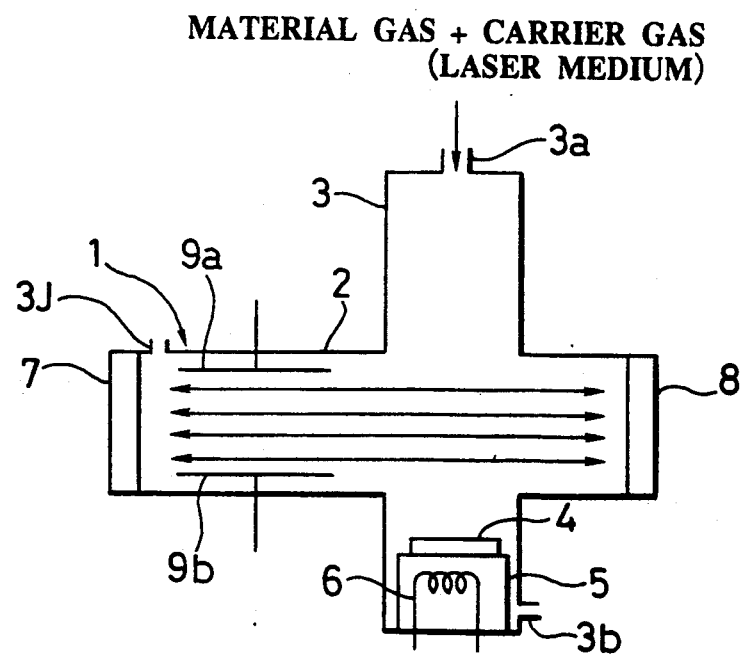
FIG.2

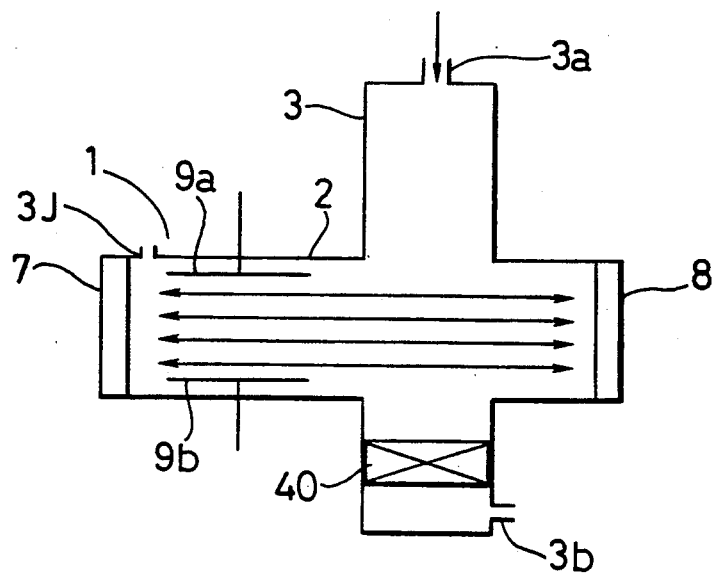
FIG.4
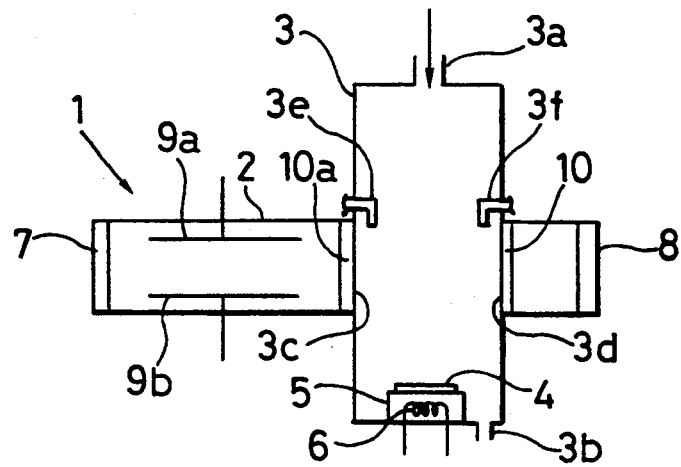

VAPOR DEPOSITION APPARATUS

BACKGROUND OF THE INVENTION

1. Field of the Invention

The present invention relates to a vapor deposition apparatus used for producing semiconductors, and particularly to a vapor deposition apparatus for efficiently producing a thin film or particles with use of light energy.

2. Description of the Prior Art

An optical CVD method uses light energy of a laser beam or of light of a lamp to form a thin film on a substrate.

FIG. 1 is a sectional view showing an example of a conventional vapor deposition apparatus employing the optical CVD method.

This apparatus comprises a reaction tube 100. The reaction tube 100 incorporates a substrate 101, a substrate holder 102 for holding the substrate 101, and a high-frequency coil 103 for heating the substrate 101 and substrate holder 102. A gas inlet 100a is formed at the top of the reaction tube 100, to introduce a material gas of, for example, $Si_2H_6$ and a carrier gas of, for example, $H_2$ into the reaction tube 100. An outlet 100b is formed at the bottom of the reaction tube 100, to discharge an unreacted gas, etc., outside the reaction tube 100.

A transparent window 104 made of, for example, quartz, is formed at a side face of the reaction tube 100 between the gas inlet 100a and the substrate 101. An optical system 105 and a laser 106 serving as a light source are disposed outside the window 104.

The material gas is introduced into the reaction tube 100 through the gas inlet 100a. The laser 106 emits a laser beam, which enters the reaction tube 100 through the optical system 105 and window 104 and irradiates the material gas. The material gas absorbs the laser beam and decomposes to deposit as a thin film on the substrate 101.

Since the laser 106, i.e., a laser resonator of this conventional vapor deposition apparatus is outside the reaction tube 100, energy of the laser beam entered into the reaction tube 100 through the window 104 drastically attenuates to about one hundredth of that of the laser beam produced inside the laser resonator. In this way, energy of a laser beam extremely attenuates once it comes out of the laser resonator.

In addition, the diameter of the laser beam is too small to decompose the material gas to form a quality thin film.

SUMMARY OF THE INVENTION

To solve these problems, an object of the invention is to provide a vapor deposition apparatus that provides an energetic beam to efficiently produce a thin film or particles.

In order to accomplish the object, a first aspect of the invention provides a vapor deposition apparatus employing a laser that includes a laser medium, an excitation medium, and a resonator. The resonator excites the laser medium with the excitation medium to generate a laser beam, which irradiates a material gas introduced into the resonator, to grow a thin film over a substrate placed in the resonator or produce particles in the vapor deposition.

A second aspect of the invention provides a vapor deposition apparatus employing a laser that includes a laser medium, an excitation medium, and a resonator. The resonator accommodates a reaction chamber, which is separated from the laser medium by light transmission members. The resonator excites the laser medium with the excitation medium to generate a laser beam, which transmits the transmission members and irradiates a material gas introduced into the reaction chamber, to deposit a thin film over a substrate placed in the reaction chamber or produce particles in the vapor deposition.

In this way, the first and second aspects of the invention introduce a material gas into a laser resonator, or a reaction chamber defined in the resonator by light transmission members. Thereafter, a laser beam of large energy produced in the resonator irradiates the material gas, to excite, ionize, or decompose the material gas to form a thin film over a substrate or produce particles in the vapor deposition.

And, in the resonator, there are many natural emission light which is impossible to take outside of the resonator. The natural light generate the excitation, ionization, or decomposition. Therefore, it is happened that the light is effectively used.

A third aspect of the invention provides a vapor deposition apparatus employing a laser that includes a laser medium, an excitation medium, and a resonator. Part of the resonator is constituted by a substrate. A material gas is introduced into the resonator, and the laser medium is excited with the excitation medium to produce a laser beam. The laser beam irradiates the material gas and substrate in the resonator, to deposit a thin film over the substrate.

In this way, the third aspect of the invention uses a substrate as part of a resonator. While a material gas is being introduced into the resonator, the substrate is irradiated with a laser beam of large energy produced in the resonator. This improves excitation efficiency on the substrate, to effectively excite, ionize, or decompose the material gas to grow a thin film over the substrate.

These and other objects, features and advantages of the present invention will be more apparent from the following detailed description of preferred embodiments in conjunction with the accompanying drawings.

BRIEF DESCRIPTION OF THE DRAWINGS

FIG. 1 is a sectional view showing an optical CVD apparatus according to a prior art;

FIG. 2 is a sectional view showing a vapor deposition apparatus according to a first embodiment of the invention;

FIG. 3 is a sectional view showing a vapor deposition apparatus according to a modification of the first embodiment of FIG. 2;

FIG. 4 is a sectional view showing a vapor deposition apparatus according to a second embodiment of the invention;

DETAILED DESCRIPTION OF THE EMBODIMENTS

Figure 5:
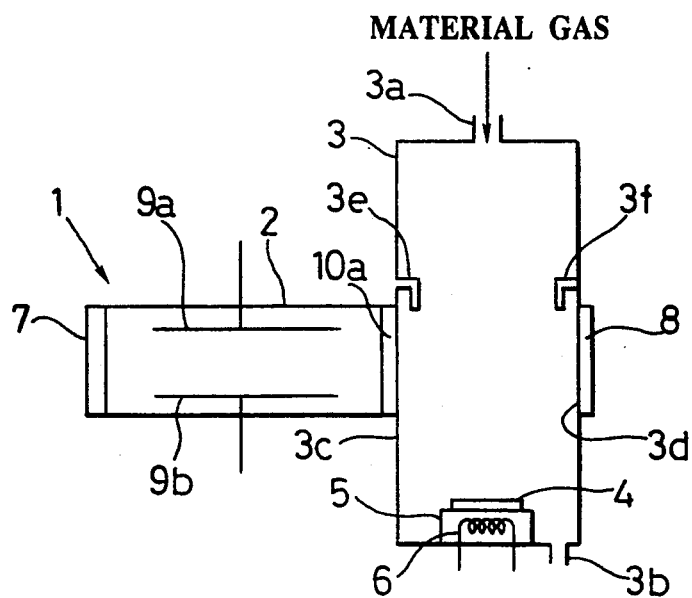
FIG. 5 is a sectional view showing a vapor deposition apparatus according to a modification of the second embodiment.

Embodiments of the invention will be explained in detail with reference to the drawings.

FIG. 2 is a sectional view showing a vapor deposition apparatus according to a first embodiment of the invention.

An argon (Ar+) laser oscillator 1 has a resonator 2. A reaction chamber 3 orthogonal to and communicating with the resonator 2 is integrally formed with the resonator 2. On the bottom of the reaction chamber 3, there are arranged a substrate 4, a substrate holder 5 for holding the substrate 4, and a high-frequency coil 6 for heating the substrate 4 and substrate holder 5.

Total reflection mirrors 7 and 8 are fitted to opposite ends of the resonator 2. Electrodes 9a and 9b are disposed inside the resonator 2. A gas inlet 3j introduces a laser medium (Ar) into the resonator 2. A gas inlet 3a for introducing a material gas of, for example, $Si_2H_6$ and a carrier gas is formed at the top of the reaction chamber 3. An outlet 3b for discharging an unreacted gas, etc., is formed at the bottom of the reaction chamber 3. The carrier gas is an Ar gas because the laser medium is Ar.

Thin film forming processes of this vapor deposition apparatus will be explained.

The high-frequency coil 6 heats the substrate 4 to a predetermined temperature. The material and carrier gases are introduced into the reaction chamber 3 through the gas inlet 3a. A voltage is applied to the electrodes 9a and 9b, which discharge electricity to excite Ar (Ar+ ions) in the resonator 2, thereby continuously producing laser beams reciprocating between the total reflection mirrors 7 and 8.

The material gas absorbs the laser beams (for example, multiple photon absorption) on the substrate 4 in the resonator 2, to excite, ionize, or decompose to grow a thin film over the substrate 4.

In this way, this embodiment emits laser beams of large energy to the material gas in the resonator, to efficiently excite, ionize, or decompose the material gas and form a quality thin film over the substrate. To match the laser medium of argon of the laser 1, the carrier gas for the material gas is also argon. This reduces a loss of laser beams in the resonator 2. It is possible to use another gas such as an $H_2$ gas as the carrier gas. In this case, a loss of laser beams in the resonator 2 may increase but a thin film is similarly formed over the substrate 4.

In this embodiment, the substrate 4 is located at the bottom of the reaction chamber 3 so that the substrate 4 may not intersect the resonator 2. Instead, the substrate 4 may be so arranged in the reaction chamber 3 to intersect the resonator 2. To increase laser oscillation efficiency, the excitation medium may be disposed on each side of the reaction chamber 3.

FIG. 3 shows a modification of the first embodiment. This employs a collecting filter 40 instead of the substrate 4, substrate holder 5, and high-frequency coil 6 of FIG. 2. The filter 40 is located at the position of the substrate 4 of FIG. 2. A material gas of, for example, $Si_2H_6$ absorbs a laser beam to excite, ionize, or decompose to form particles, which are collected by the collecting filter 40. The collected particles are used for another purpose.

FIG. 4 is a sectional view showing a vapor deposition apparatus according to a second embodiment of the invention.

An argon (Ar+) laser 1 has a resonator 2 and a reaction chamber 3 which orthogonally intersects the resonator 2. At the bottom of the reaction chamber 3, there are arranged a substrate 4, a substrate holder 5 for holding the substrate 4, and a high-frequency coil 6 for heating the substrate 4 and substrate holder 5. A gas inlet 3a for introducing a material gas of, for example, $Si_2H_6$ and a carrier gas of, for example, $H_2$ is formed at the top of the reaction chamber 3. An outlet 3b for discharging an unreacted gas, etc., out of the reaction chamber 3 is formed at the bottom of the reaction chamber 3.

A laser medium of argon (Ar) is sealed inside the resonator 2. Total reflection mirrors 7 and 8 are arranged at opposite ends of the resonator 2. Electrodes 9a and 9b are arranged inside the resonator 2. Openings 3c and 3d are formed at the intersection of the resonator 2 and reaction chamber 3. Transparent windows 10a and 10b made of quartz cover the openings 3c and 3d, respectively. The windows 10a and 10b airtightly separate the resonator 2 from the reaction chamber 3. Gas inlets 3e and 3f are disposed inside the reaction chamber 3, to guide a purge gas along the windows 10a and 10b.

Thin film growing processes of this vapor deposition apparatus will be explained.

The high-frequency coil 6 heats the substrate 4 to a predetermined temperature. The material and carrier gases are introduced into the reaction chamber 3 through the gas inlet 3a. A voltage is applied to the electrodes 9a and 9b, which discharge electricity to excite Ar in the resonator 2 to continuously generate laser beams. The laser beams reciprocate between the mirrors 7 and 8 through the windows 10a and 10b. The purge gas is introduced from the gas inlets 3e and 3f, to prevent the material gas from adhering to the windows 10a and 10b. The material gas absorbs the laser beams to excite, ionize, or decompose, thereby growing a thin film over the substrate 4.

Similar to the first embodiment, the second embodiment efficiently forms a thin film over the substrate 4 with laser beams of large energy produced in the resonator 2. Since the reaction chamber 3 is airtight in the resonator 2, the material and carrier gases introduced into the reaction chamber 3 do not enter the resonator 2, so that the resonator 2 may effectively produce laser beams. Also, when particles are produced, a collecting filter as shown in FIG. 3 is used to collect the particles.

FIG. 5 is a sectional view showing a vapor deposition apparatus according to a modification of the second embodiment.

A resonator 2 has a total reflection mirror 7. A reaction chamber 3 has an opening 3d where a total reflection mirror 8 is disposed to oppose the mirror 7. Namely, the reaction chamber 3 is formed along an end face of the mirror 8 of the resonator 2. The other parts and thin film forming processes of this modification are the same as those of the second embodiment.

Figure 6:
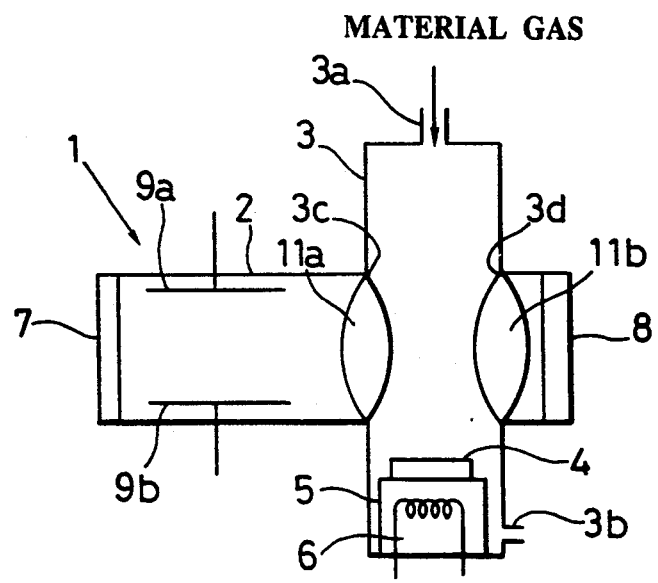
FIG. 6 is a sectional view showing a vapor deposition apparatus according to a third embodiment of the invention.

FIG. 6 shows a section of a vapor deposition apparatus according to a third embodiment of the invention.

A resonator 2 of an argon (Ar+) laser 1 orthogonally intersects a reaction chamber 3. Openings 3c and 3d are formed at the intersection of the resonator 2 and reaction chamber 3, and convex lenses 11a and 11b airtightly cover the openings 3c and 3d, respectively. The convex lenses 11a and 11b focus around the center of the reaction chamber 3. The other parts of this embodiment are the same as those of the second embodiment.

Laser beams produced between the total reflection mirrors 7 and 8 in the resonator 2 are collected by the convex lenses 11a and 11b. A material gas of, for example, $Si_2H_6$ introduced from the gas inlet 3a into the reaction chamber 3 flows across the laser beams collected by the convex lenses 11a and 11b. This improves a nonlinear light absorbing effect (multiple photon absorption) of the material gas, to efficiently decompose the material gas and form a good thin film over the substrate 4.

Figure 7:
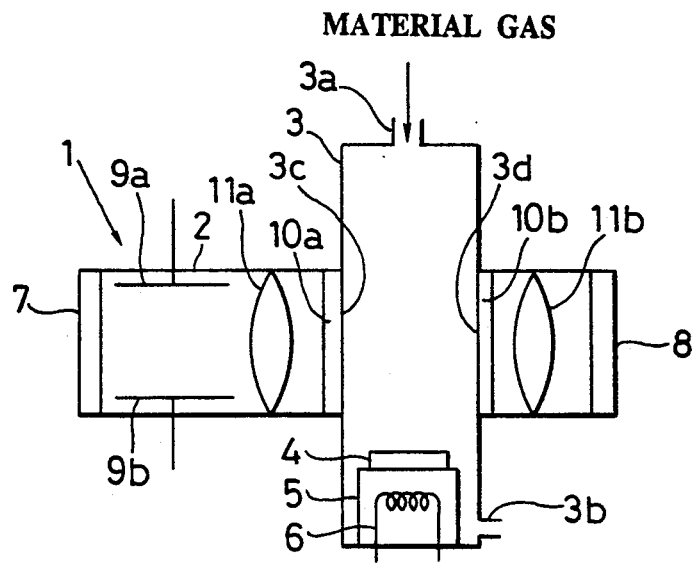
FIG. 7 is a sectional view showing a vapor deposition apparatus according to a modification of the third embodiment of the invention.

FIG. 7 shows a vapor deposition apparatus according to a modification of the third embodiment.

A resonator 2 intersects a reaction chamber 3, and openings 3c and 3d are formed at the intersection of the resonator 2 and reaction chamber 3. Transparent windows 10a and 10b made of, for example, quartz cover the openings 3c and 3d, respectively. Convex lenses 11a and 11b are disposed inside the resonator 2, to focus at around the center of the reaction chamber 3.

Figure 8:
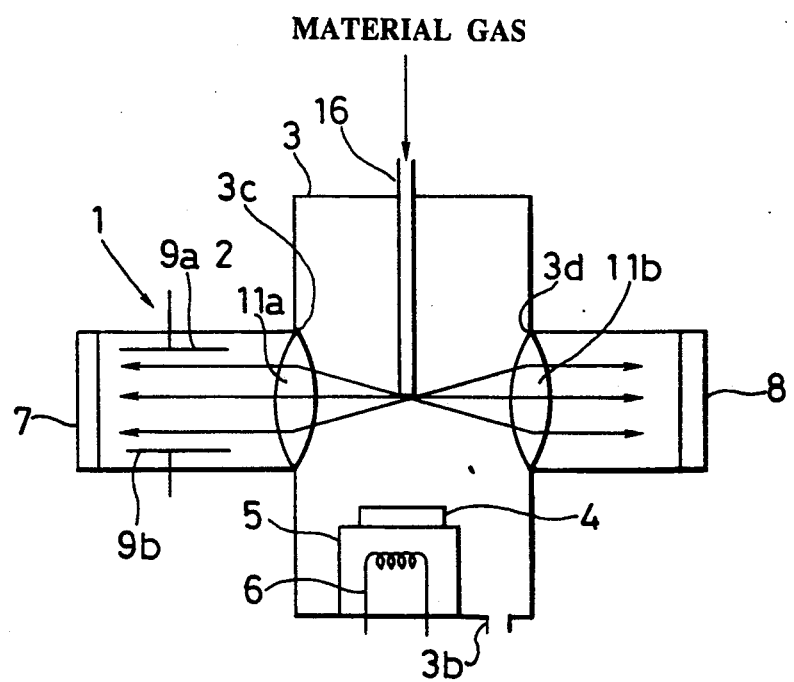
FIG. 8 is a sectional view showing a vapor deposition apparatus according to a fourth embodiment of the invention.

FIG. 8 is a sectional view showing a fourth embodiment of the invention. This embodiment is based on the third embodiment of FIG. 6.

A gas guide tube 16 for guiding a material gas and a carrier gas extends from the top of a reaction chamber 3 to a focal point of convex lenses 11a and 11b. The other parts of this embodiment are the same as those of the third embodiment.

Since the gas guide tube 16 for guiding the material and carrier gases into the reaction chamber 3 is oriented to the focal point of the convex lenses 11a and 11b, the material gas is collectively guided to the point where laser beams focus. This arrangement improves a nonlinear light absorbing effect of the material gas, to efficiently decompose the material gas to form a quality thin film over the substrate 4.

Also, when particles are produced, the production is achieved efficiently.

The third and fourth embodiments of FIGS. 6 and 7 may have gas inlets for guiding a purge gas along the convex lenses 11a and 11b or windows 10a and 10b in the reaction chamber 3, to prevent the material gas from adhering to the convex lenses.

Also, the third and fourth embodiments may have two concave mirrors at opposing ends of the resonator 2, instead of a combination of the total reflection mirrors 7 and 8 and convex lenses 11a and 11b or windows 10a and 10b.

Figure 9:
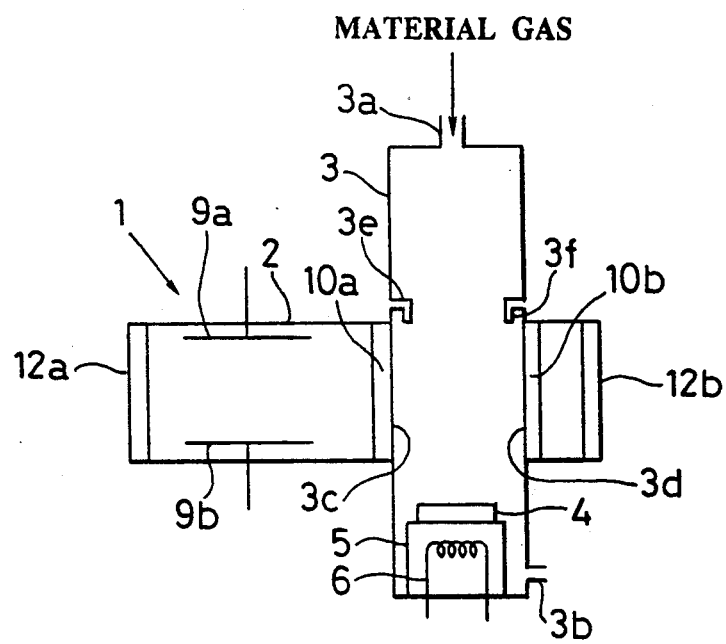
FIG. 9 is a sectional view showing a vapor deposition apparatus according to a fifth embodiment of the invention.

FIG. 9 shows a section of a vapor deposition apparatus according to a fifth embodiment of the invention. This is based on the second embodiment of FIG. 4.

An argon (Ar+) laser oscillator 1 has a resonator 2. Complex conjugate mirrors 12a and 12b for reflecting a beam into an incident direction are arranged at opposite ends of the resonator 2. The other parts of this embodiment are the same as those of the second embodiment.

A voltage is applied to the electrodes 9a and 9b, which discharge electricity to excite Ar in the resonator 2 to produce laser beams, which are continuously oscillated between the complex conjugate mirrors 12a and 12b.

Even if the laser beams are refracted by a varying concentration of a material gas of, for example, $Si_2H_6$ introduced into the reaction chamber 3, the complex conjugate mirrors 12a and 12b reflect the beams into an incident direction, to reduce a loss of the laser beams. As a result, the material gas efficiently absorbs the laser beams produced between the complex conjugate mirrors 12a and 12b, thereby effectively forming a thin film or particles over the substrate 4.

Figure 10:
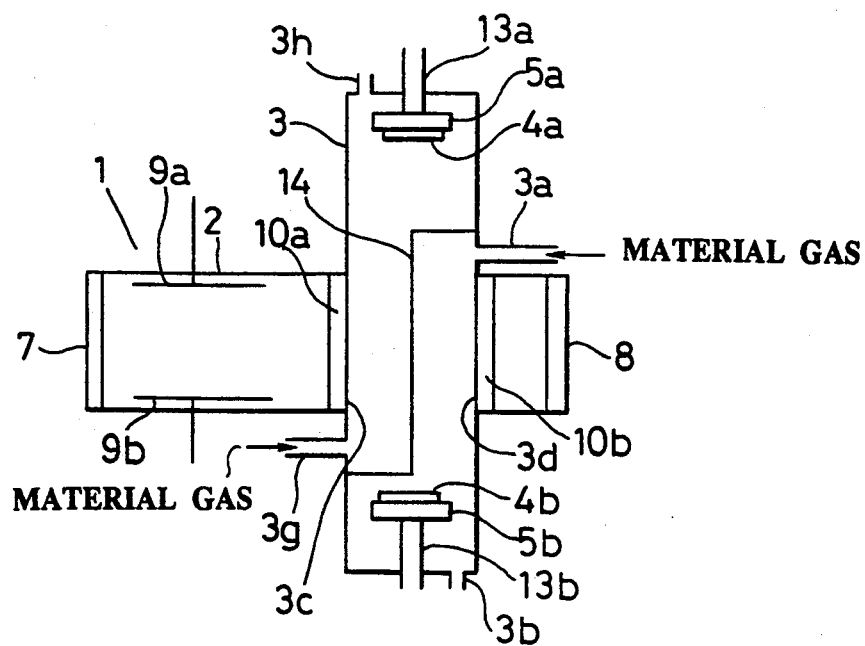
FIG. 10 is a sectional view showing a vapor deposition apparatus according to a sixth embodiment of the invention.

FIG. 10 shows a section of a vapor deposition apparatus according to a sixth embodiment of the invention.

An argon (Ar+) laser 1 has a resonator 2 and a reaction chamber 3, which orthogonally intersects the resonator 2. At upper and lower parts of the reaction chamber 3, there are arranged substrates 4a and 4b, substrate holders 5a and 5b for holding the substrates 4a and 4b, respectively, high-frequency coils (not shown) for heating the substrates 4a and 4b and substrate holders 5a and 5b, and rotary shafts 13a and 13b for rotatably supporting the substrate holders 5a and 5b, respectively. The rotary shafts are connected to motors (not shown).

A transparent partition plate 14 made of, for example, quartz is disposed orthogonally to the resonator 2, to longitudinally (vertically) separate the reaction chamber 3 into upper and lower chambers. The lower chamber has a gas inlet 3a for introducing a material gas of, for example, $Si_2H_6$ and a carrier gas of, for example, $H_2$, and a gas outlet 3b for discharging an unreacted gas, etc., out of the lower chamber. Similarly, the upper chamber has a gas inlet 3g gas outlet 3h. The other parts of this embodiment are the same as those of the second embodiment.

This film forming processes of this embodiment will be explained.

The high-frequency coils (not shown) heat the respective substrates 4a and 4b in the reaction chamber 3 to a predetermined temperature. The motors (not shown) turn the substrate holders 5a and 5b and substrates 4a and 4b. The same material gas of, for example, $Si_2H_6$ and the same carrier gas of, for example, $H_2$ are introduced into the upper and lower reaction chambers through the gas inlets 3a and 3g. A voltage is applied to the electrodes 9a and 9b to discharge electricity in the resonator 2 to excite Ar to continuously oscillate laser beams between the total reflection mirrors 7 and 8 through the windows 10a and 10b and partition plate 14.

The material gases absorb the laser beams in the reaction chamber 3, to excite, ionize, or decompose to deposit as thin films over the substrates 4a and 4b in the upper and lower reaction chambers.

Since the reaction chamber 3 is separated into the two chambers by the partition plate 14 at the position where laser beams pass, thin films are simultaneously grown over the substrates 4a and 4b in the separate chambers. Since the material gases oppositely flow in the two reaction chambers, deflections of laser beams caused by fluctuations in concentrations of the material gases cancel each other to reduce a loss of the laser beams.

Instead of supplying the same material gas into the chambers separated by the partition plate 14 in the reaction chamber 3 through the gas inlets 3a and 3g, it is possible to supply different gases into the separated chambers, respectively.

Figure 11:
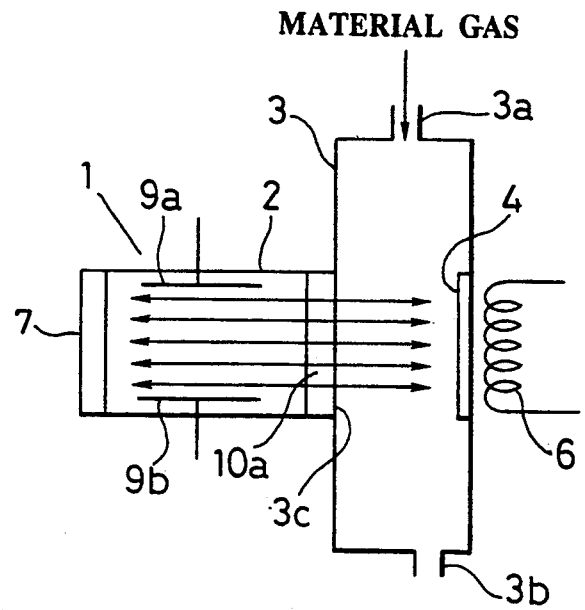
FIG. 11 is a sectional view showing a vapor deposition apparatus according to a seventh embodiment of the invention.

FIG. 11 shows a section of a vapor deposition apparatus according to the seventh embodiment of the invention.

An argon ($Ar^+$) laser oscillator 1 has a resonator 2. A reaction chamber 3 is formed along one end face of the resonator 2. An opening 3c is formed at the intersection of the resonator 2 and reaction chamber 3. A transparent window 10a made of, for example, quartz airtightly covers the opening 3c. The other end face of the resonator 2 opposite to the reaction chamber 3 has a total reflection mirror 7. A substrate 4 such as a silicon substrate substituting for a total reflection mirror is disposed in the reaction chamber 3 opposite to the total reflection mirror 7.

A high-frequency coil heater 6 is disposed outside the substrate 4 of the reaction chamber 3. A gas inlet 3a for introducing a material gas of, for example, $Si_2H_6$ and a carrier gas of, for example, $H_2$ is formed at the top of the reaction chamber 3. A gas outlet 3b for discharging an unreacted gas, etc., is formed at the bottom of the reaction chamber 3. Electrodes 9a and 9b are arranged inside the resonator 2.

A voltage is applied to the electrodes 9a and 9b, which then discharge electricity to excite argon (Ar) in the resonator 2 to continuously oscillate laser beams between the total reflection mirror 7 and the substrate 4. The high-frequency coil 6 heats the substrate 4 to a predetermined temperature, and the laser beams excite the surface of the substrate 4. Accordingly, the material gas introduced with the carrier gas into the reaction chamber 3 through the gas inlet 3a is decomposed to form a thin film over the substrate 4.

Since laser beams of large energy directly irradiate the substrate 4 substituting for a total reflection mirror of the resonator 2, the thin film is efficiently formed over the substrate 4.

The window 10a may be a half mirror to form a resonator between the half mirror and the total reflection mirror 7 and another resonator between the substrate 4 and the total reflection mirror 7. The resonator between the half mirror and the total reflection mirror 7 may stabilize laser beams.

Figure 12:
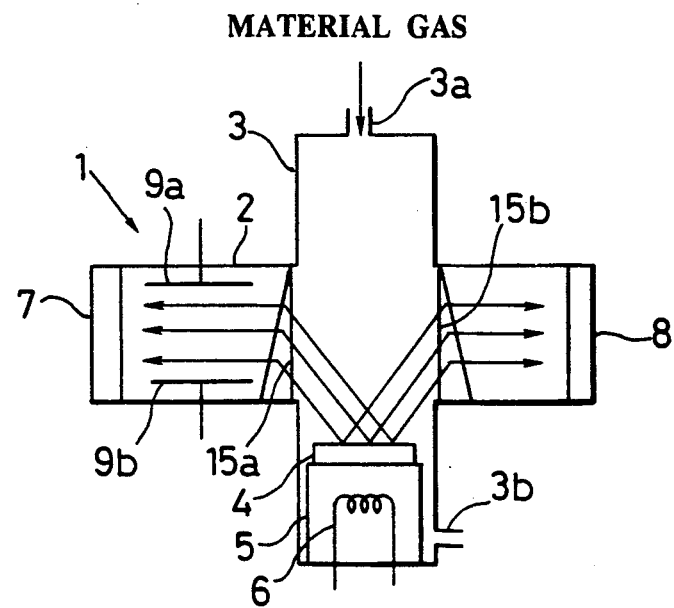
FIG. 12 is a sectional view showing a vapor deposition apparatus according to an eighth embodiment of the invention.

FIG. 12 is a sectional view showing a vapor deposition apparatus according to an eighth embodiment of the invention. This embodiment is based on the second embodiment of FIG. 4.

An argon ($Ar^+$) laser 1 has a resonator 2. A reaction chamber 3 orthogonally intersects the resonator 2. Prisms 15a and 15b are airtightly arranged at the intersection of the resonator 2 and reaction chamber 3. The prisms 15a and 15b deflect laser beams obtained between total reflection mirrors 7 and 8 of the resonator 2 toward a substrate 4, and guide reflections of the laser beams from the substrate 4 toward the total reflection mirrors 7 and 8. The other arrangements of this embodiment are the same as those of the second embodiment.

A voltage is applied to the electrodes 9a and 9b, which discharge electricity to excite Ar atoms in the resonator 2 to continuously oscillate laser beams between the total reflection mirrors 7 and 8 and the substrate 4 through the prisms 15a and 15b. The high-frequency coil 6 heats the substrate 4 to a predetermined temperature. The laser beams excite the surface of the substrate 4 and decompose a material gas introduced into the reaction chamber 3, to form a thin film over the substrate 4.

In this way, the resonator 2 of this embodiment provides laser beams of large energy, which directly irradiate the substrate 4 through the prisms 15a and 15b, to efficiently form a thin film over the substrate 4.

Although the first to eighth embodiments employ the $Ar^+$ gas laser, the invention may employ other gas laser such as an He-Ne laser, $N_2$ laser, $CO_2$ laser, excimer laser, and chemical laser.

Figure 13:
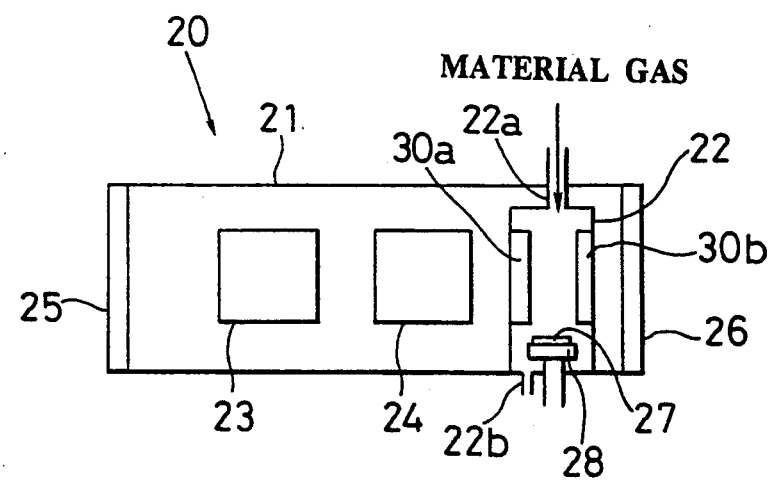
FIG. 13 is a sectional view showing a vapor deposition apparatus according to a ninth embodiment of the invention.

FIG. 13 is a sectional view showing a vapor deposition apparatus according to a ninth embodiment of the invention.

A solid state laser (a YAG laser in the figure) 20 has a resonator 21. A reaction chamber 22 is formed inside the resonator 21. The resonator 21 incorporates an oscillator 23 and an etalon 24. Total reflection mirrors 25 and 26 are disposed at opposite ends of the resonator 21. The reaction chamber 22 is located between the etalon 24 and the total reflection mirror 26.

At the bottom of the reaction chamber 22, there are arranged a substrate 27, a substrate holder 28 for holding the substrate 27, and a high-frequency coil (not shown) for heating the substrate 27 and substrate holder 28. A gas inlet 22a for introducing a material gas of, for example, $Si_2H_6$ and a carrier gas of, for example, $H_2$ is formed at the top of the reaction chamber 22. A gas outlet 22b for discharging an unreacted gas, etc., out of the reaction chamber 22 is formed at the bottom of the reaction chamber 22. Windows 30a and 30b made of, for example, quartz airtightly cover the side faces of the reaction chamber 22, and face the etalon 24 and total reflection mirror 26.

The material gas introduced into the reaction chamber 22 through the gas inlet 22a absorbs laser beams produced by the resonator 21 and passed through the reaction chamber 22. Accordingly, the material gas is excited, ionized, or decomposed to grow a thin film over the substrate 27. Also, when particles are produced, a collecting filter as shown in FIG. 3 is used to collect the particles.

Figure 14:
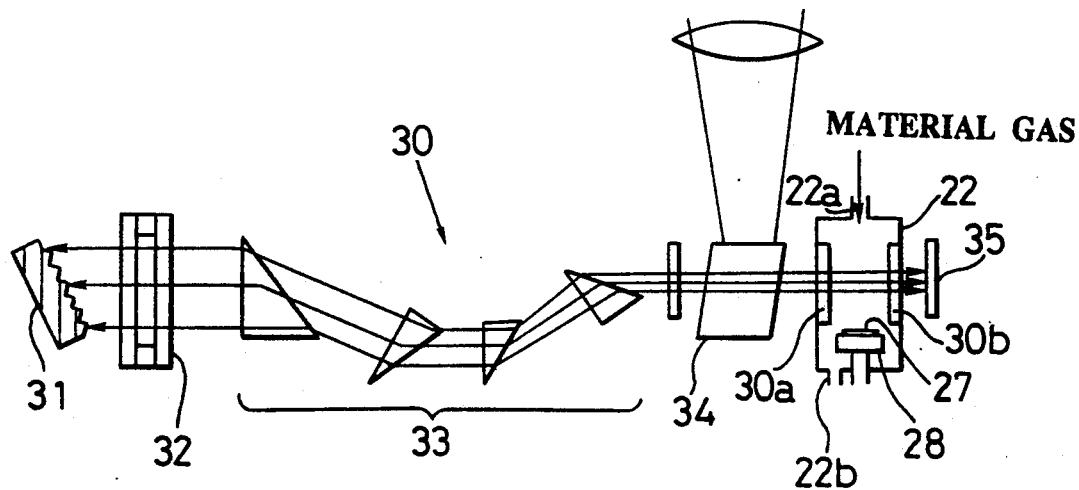
FIG. 14 is a sectional view showing a vapor deposition apparatus according to a tenth embodiment of the invention.

FIG. 14 is a view showing a vapor deposition apparatus according to a tenth embodiment of the invention.

A dye laser 30 has a resonator (not shown). A reaction chamber 22 is disposed inside the resonator. The resonator includes a grating 31, and etalon 32, a beam enlarger 33, a dye cell 34, and a total reflection mirror 35. The reaction chamber 22 is located between the dye cell 34 and the total reflection mirror 35 and has the same configuration as in the ninth embodiment of FIG. 13.

A material gas of, for example, $Si_2H_6$ is introduced into the reaction chamber 22 through a gas inlet 22a. Dye laser beams are produced in the resonator, passed through the windows 30a and 30b and reaction chamber 22, and absorbed by the material gas. Accordingly, the material gas is excited, ionized, or decomposed to form a thin film over the substrate 27.

Similar to the gas lasers mentioned before, the solid state laser 20 and dye laser 30 of FIGS. 13 and 14 provide laser beams of large energy, which are efficiently absorbed by a material gas in the resonator. As a result, the material gas is efficiently decomposed to effectively form a thin film over the substrate or produce particles in the vapor deposition.

Figure 15:
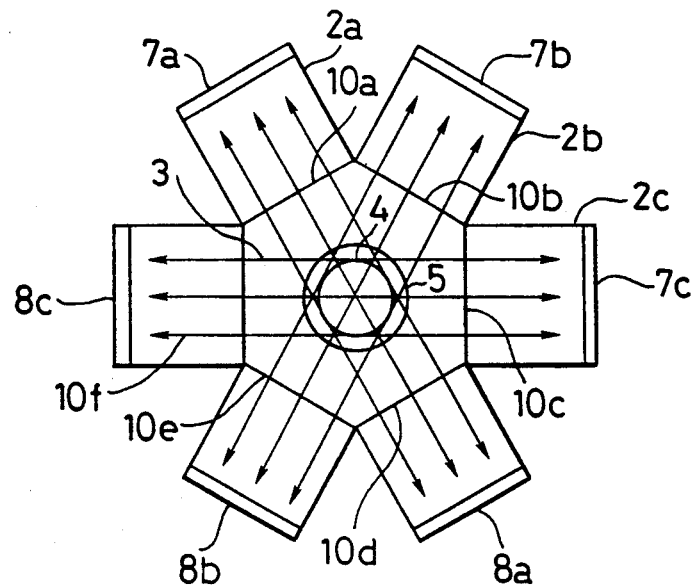
FIG. 15 is a sectional view showing a vapor deposition apparatus according to an eleventh embodiment of the invention.

FIG. 15 is a plan view showing a vapor deposition apparatus according to an eleventh embodiment of the invention.

A plurality (three in the figure) of lasers (gas laser oscillators in the figure) involving resonators 2a, 2b, and 2c are arranged on the same plane at intervals of about 60 degrees. A reaction chamber 3 is formed in the middle of these resonators.

Each of the resonators 2a, 2b, and 2c and the reaction chamber 3 basically have the same arrangements as those of the second embodiment of FIG. 4. Total reflection mirrors 7a, 7b, 7c, 8a, 8b, and 8c are arranged at ends of the resonators 2a, 2b, and 2c. Transparent windows 10a, 10b, 10c, 10d, 10e, and 10f are arranged at the intersection of the resonators 2a, 2b, and 2c and reaction chamber 3. At the bottom of the reaction chamber 3, there are arranged a substrate 4, a substrate holder 5 for holding the substrate 4, and a high-frequency coil (not shown) for heating the substrate 4 and substrate holder 5.

The resonators 2a, 2b, and 2c produce laser beams of the same kind, which pass through the windows 10a, 10b, 10c, 10d, 10e, and 10f and the reaction chamber 3. A material gas of, for example, $Si_2H_6$ is introduced into the reaction chamber 3. The material gas absorbs the laser beams, to excite, ionize, or decompose to deposit as a thin film over the substrate 4 or produce particles in the vapor deposition.

The laser beams of the same kind produced by the resonators 2a, 2b, and 2c have higher intensity than laser beams produced by the previous embodiments. The eleventh embodiment, therefore, grows a thin film more efficiently.

The resonators 2a, 2b, and 2c may generate different kinds of laser beams. In this case, the material gas absorbs the different kinds of laser beams, to demonstrate a plurality of reactions in forming a thin film over the substrate 4.

Figure 16:
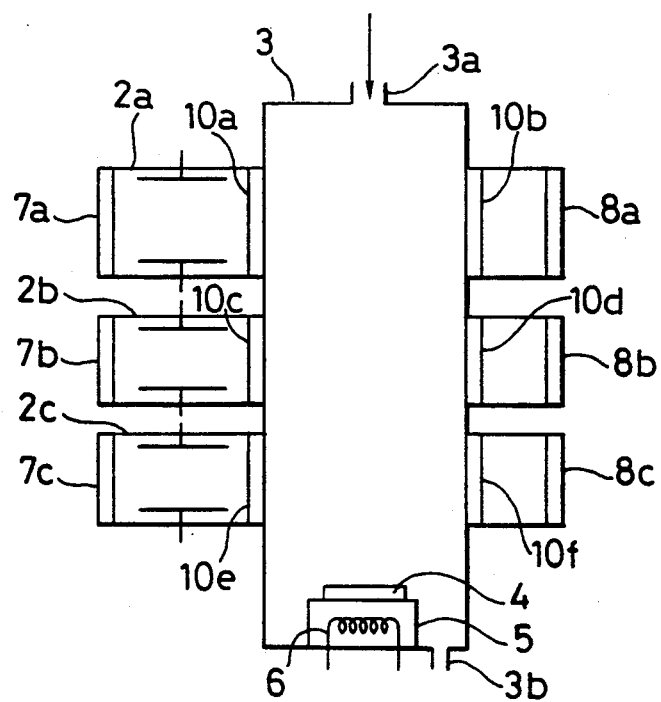
FIG. 16 is a sectional view showing a vapor deposition apparatus according to a twelfth embodiment of the invention.

While the eleventh embodiment of FIG. 15 arranges the resonators 2a, 2b, and 2c on the same plane around the reaction chamber 3, a twelfth embodiment shown in FIG. 16 vertically arranges a plurality (three in the figure) of resonators 2a, 2b, and 2c of lasers (for example, gas lasers). A reaction chamber 3 is formed in the resonators.

Each of the resonators 2a, 2b, and 2c and the reaction chamber 3 basically have the same arrangements as those of the second embodiment of FIG. 4.

Total reflection mirrors 7a, 7b, 7c, 8a, 8b, and 8c are arranged at ends of the resonators 2a, 2b, and 2c. Transparent windows 10a, 10b, 10c, 10d, 10e, and 10f are arranged at the intersection of the resonators 2a, 2b, and 2c and reaction chamber 3. At the bottom of the reaction chamber 3, there are arranged a substrate 4, a substrate holder 5 for holding the substrate 4, and a high-frequency coil 6 for heating the substrate 4 and substrate holder 5.

A material gas of, for example, $Si_2H_6$ is guided into the reaction chamber 3 through a gas inlet 3a. The resonators 2a, 2b, and 2c generate laser beams of the same or different kings, which pass through the windows 10a, 10b, 10c, 10d, 10e, and 10f and reaction chamber 3. The material gas absorbs the laser beams, to excite, ionize, or decompose to form a thin film over the substrate 4 or produce particles in the vapor deposition.

A thirteenth embodiment of the invention employs a laser using a plurality of laser media. This embodiment may be realized with the vapor deposition apparatus of FIG. 2. The laser media may be Ar and Kr to produce laser beams of different wavelengths out of a single resonator. A material gas absorbs these laser beams and demonstrates a plurality of reactions in forming a thin film over a substrate 4.

In the above embodiments, all or part of the total reflection mirrors 8, 26, and 35 disposed at ends of the resonators 2 and 21 may transmit about 1% of light. In this case, the quantity of light absorbed by a material gas is measurable according to the intensity of the 1% light.

It is not always necessary to airtightly separate the reaction chamber 3 with the windows 10a, 10b, 30a, and 30b, convex lenses 11a and 11b, complex conjugate mirrors 12a and 12b, and prisms 15a and 15b. This, however, deteriorates efficiency.

In summary, the invention produces laser beams of large energy from a laser resonator when forming a thin film over a substrate. Due to the large beam energy, a material gas is efficiently decomposed to effectively deposit the thin film over the substrate.

Various modifications will become possible for those skilled in the art after receiving the teachings of the present disclosure without departing from the scope thereof.

What is claimed is:

1. A vapor deposition apparatus comprising:
   (a) a laser having a resonator for exciting a laser medium with an excitation medium, to produce a laser beam; and
   (b) means for introducing a material gas into the resonator so that the laser beam may irradiate the material gas to cause a photochemical reaction of the material gas in the resonator.

2. The vapor deposition apparatus according to claim 1, wherein the laser beam for irradiating the material gas in the resonator is a reciprocating laser beam continuously oscillated between at least two reflecting members.

3. The vapor deposition apparatus according to claim 1, wherein the photochemical reaction of the material gas caused by the laser beam is a light absorbing reaction of the material gas by which the material gas is excited, ionized, or decomposed.

4. The vapor deposition apparatus according to claim 1, further comprising a reaction chamber which orthogonally intersects the resonator and is integrally formed with the resonator.

5. The vapor deposition apparatus according to claim 4, wherein the inside of the resonator communicates with the inside of the reaction chamber.

6. The vapor deposition apparatus according to claim 5, wherein said gas introducing means introduces the material gas as well as a carrier gas of the same kind as the laser medium into the reaction chamber.

7. The vapor deposition apparatus according to claim 4, wherein a substrate on which particles produced by the photochemical reaction are deposited, a substrate holder for holding the substrate, and a high-frequency coil for heating the substrate and substrate holder are disposed at the bottom of the reaction chamber.

8. The vapor deposition apparatus according to claim 4, wherein a collecting filter is disposed at the bottom of the reaction chamber, to collect particles that are produced from the material gas when the material gas absorbs the laser beam to excite, ionize, or decompose.

9. The vapor deposition apparatus according to claim 4, wherein the resonator is separated from the reaction chamber with light transmitting means.

10. The vapor deposition apparatus according to claim 9, wherein the light transmitting means is a condenser lens for collecting the laser beam.

11. The vapor deposition apparatus according to claim 10, wherein the gas introducing means collectively introduces the material gas to a focal point of the condenser lens.

12. The vapor deposition apparatus according to claim 2, wherein one of the reflecting member is a substrate on which vapor deposition due to the photochemical reaction is generated.

13. The vapor deposition apparatus according to claim 2, wherein the resonator excites a plurality of laser media with the excitation medium to produce a plurality of laser beams for irradiating the material gas.

14. The vapor deposition apparatus according to claim 4, wherein a plurality of resonators are arranged around the reaction chamber.

15. A vapor deposition apparatus comprising:
   (a) a laser having a resonator for exciting a laser medium with an excitation medium, to produce a laser beam;
   (b) a reaction chamber formed in the resonator and separated from the laser medium with light transmitting means; and
   (c) means for introducing a material gas into the reaction chamber so that the laser beam may irradiate the material gas in the reaction chamber to cause a photochemical reaction of the material gas.

16. The vapor deposition apparatus according to claim 15, wherein the laser beam for irradiating the material gas is a reciprocating laser beam continuously oscillated between at least two reflecting members.

17. The vapor deposition apparatus according to claim 15, wherein the photochemical reaction of the material gas caused by the laser beam is a light absorbing reaction of the material gas by which the material gas is excited, ionized, or decomposed.

18. The vapor deposition apparatus according to claim 15, wherein a substrate on which particles produced by the photochemical reaction are deposited, a substrate holder for holding the substrate, and a high-frequency coil for heating the substrate and substrate holder are disposed at the bottom of the reaction chamber.

19. The vapor deposition apparatus according to claim 15, wherein a collecting filter is disposed at the bottom of the reaction chamber, to collect particles that are produced from the material gas when the material gas absorbs the laser beam to excite, ionize, or decompose.

20. The vapor deposition apparatus according to claim 15, wherein the light transmitting means is a condenser lens for collecting the laser beam.

21. The vapor deposition apparatus according to claim 20, wherein the gas introducing means collectively introduces the material gas to a focal point of the condenser lens.

22. A vapor deposition apparatus comprising:
   (a) a laser having a resonator for exciting a laser medium with an excitation medium, to produce a laser beam; and
   (b) means for introducing a material gas into the resonator so that the laser beam may irradiate the material gas to cause a photochemical reaction of the material gas in the resonator,
   (c) the laser beam for irradiating the material gas in the resonator being continuously oscillated between a reflecting member and a substrate on which vapor deposition by the photochemical reaction is generated.

23. The vapor deposition apparatus according to claim 22, wherein the photochemical reaction of the material gas caused by the laser beam is a light absorbing reaction of the material gas by which the material gas is excited, ionized, or decomposed.

24. The vapor deposition apparatus according to claim 22, further comprising a reaction chamber which orthogonally intersects the resonator and is integrally formed with the resonator.

25. The vapor deposition apparatus according to claim 24, wherein the resonator is separated from the reaction chamber with light transmitting means.

26. The vapor deposition apparatus according to claim 25, wherein the light transmitting means is a condenser lens for collecting the laser beam.

27. The vapor deposition apparatus according to claim 3, wherein the light absorbing reaction is a multiple photon absorbing reaction.

28. The vapor deposition apparatus according to claim 17, wherein the light absorbing reaction is a multiple photon absorbing reaction.

29. The vapor deposition apparatus according to claim 23, wherein the light absorbing reaction is a multiple photon absorbing reaction.

* * * * *